(12) United States Patent
Onoue et al.

(10) Patent No.: US 7,635,519 B2
(45) Date of Patent: Dec. 22, 2009

(54) COMPOSITE DIELECTRIC SHEET, METHOD FOR PRODUCING COMPOSITE DIELECTRIC SHEET, AND MULTILAYER ELECTRONIC COMPONENT

(75) Inventors: Tomoaki Onoue, Yasu (JP); Yasunori Hioki, Yasu (JP); Norihiro Yoshikawa, Koka (JP); Ichiro Nakamura, Kusatsu (JP)

(73) Assignee: Murata Manufacturting Co., Ltd. (JP)

( * ) Notice: Subject to any disclaimer, the term of this patent is extended or adjusted under 35 U.S.C. 154(b) by 0 days.

(21) Appl. No.: 11/858,489

(22) Filed: Sep. 20, 2007

(65) Prior Publication Data

US 2008/0014430 A1    Jan. 17, 2008

Related U.S. Application Data

(63) Continuation of application No. PCT/JP2006/301621, filed on Feb. 1, 2006.

(30) Foreign Application Priority Data

Mar. 23, 2005    (JP)    ............................ 2005-083747

(51) Int. Cl.
  *B32B 9/04*    (2006.01)
  *B32B 27/38*   (2006.01)
  *B32B 5/00*    (2006.01)
  *C08G 18/22*   (2006.01)

(52) U.S. Cl. .................... 428/411.1; 428/413; 428/416; 428/323; 528/55

(58) Field of Classification Search .................. 428/323, 428/411.1, 413, 416
See application file for complete search history.

(56) References Cited

U.S. PATENT DOCUMENTS

| 2,917,416 | A | | 12/1959 | Lavin et al. |
| 3,412,354 | A | * | 11/1968 | Sattler ........................ 336/205 |
| 4,207,427 | A | | 6/1980 | Beretta et al. |
| 4,702,980 | A | * | 10/1987 | Matsuura et al. .............. 430/63 |
| 4,719,255 | A | * | 1/1988 | Yoshizumi et al. .......... 523/436 |
| 5,004,641 | A | * | 4/1991 | Kondo et al. ................. 428/208 |
| 5,275,878 | A | * | 1/1994 | Yamakawa et al. ....... 428/306.6 |

(Continued)

FOREIGN PATENT DOCUMENTS

JP    3-208324    9/1991

(Continued)

OTHER PUBLICATIONS

Written Opinion with English Language Translation.

(Continued)

*Primary Examiner*—Randy Gulakowski
*Assistant Examiner*—Robert Loewe
(74) *Attorney, Agent, or Firm*—Ostrolenk Faber LLP (57) ABSTRACT

A composite dielectric sheet used to manufacture a multilayer electronic component. The composite dielectric sheet is flexible and has a high dielectric constant and high dielectric strength. The composite dielectric sheet contains a polyvinyl acetal resin; a high-dielectric constant filler, surface-treated with a coupling agent, dispersed in the polyvinyl acetal resin; and a crosslinking agent having two or more functional groups reactable with the polyvinyl acetal resin and the surface-treated high-dielectric constant filler. The composite dielectric sheet is suitable for use in a multilayer electronic component such as a monolithic capacitor.

23 Claims, 2 Drawing Sheets

U.S. PATENT DOCUMENTS

| | | | |
|---|---|---|---|
| 5,332,712 A * | 7/1994 | Shinohara et al. | 503/227 |
| 5,707,729 A * | 1/1998 | Satoh | 428/344 |
| 6,287,696 B1 * | 9/2001 | Noda et al. | 428/411.1 |
| 6,352,957 B2 * | 3/2002 | Takao et al. | 503/227 |
| 6,403,221 B1 * | 6/2002 | Nakamura et al. | 428/416 |
| 6,645,630 B1 * | 11/2003 | Nakamura et al. | 428/413 |
| 6,653,383 B2 * | 11/2003 | Hirano et al. | 524/413 |
| 6,716,530 B2 * | 4/2004 | Sato et al. | 428/416 |
| 6,841,605 B1 * | 1/2005 | Kumakura et al. | 524/430 |
| 6,881,293 B2 * | 4/2005 | Nakamura et al. | 156/307.1 |
| 6,936,644 B2 * | 8/2005 | Gilleo | 523/205 |
| 2004/0053061 A1 * | 3/2004 | Yonezawa et al. | 428/458 |
| 2005/0003199 A1 * | 1/2005 | Takaya et al. | 428/413 |
| 2005/0008868 A1 * | 1/2005 | Nakamura et al. | 428/414 |
| 2005/0196619 A1 * | 9/2005 | Nakanishi et al. | 428/416 |
| 2006/0105176 A1 * | 5/2006 | Narabu et al. | 428/416 |
| 2006/0154078 A1 * | 7/2006 | Watanabe et al. | 428/413 |
| 2006/0204885 A1 * | 9/2006 | Molaire et al. | 430/135 |

FOREIGN PATENT DOCUMENTS

| | | |
|---|---|---|
| JP | 4-325453 | 11/1992 |
| JP | 6-52716 | 2/1994 |
| JP | 2000-186133 | 7/2000 |
| JP | 2000-265013 | 9/2000 |
| JP | 2000-294447 | 10/2000 |
| JP | 2002-212390 | 7/2002 |
| JP | 2004-119483 | 4/2004 |
| JP | 2004-266229 | 9/2004 |

OTHER PUBLICATIONS

International Search Report issued Mar. 23, 2005.

Extended or Supplementary European Search Report issued Jul. 9, 2009 in connection with corresponding European Patent Application No. 06 712 764.7.

* cited by examiner

COMPOSITE DIELECTRIC SHEET, METHOD FOR PRODUCING COMPOSITE DIELECTRIC SHEET, AND MULTILAYER ELECTRONIC COMPONENT

CROSS-REFERENCE TO RELATED APPLICATIONS

This is a continuation under 35 U.S.C. §111(a) of PCT/JP2006/301621 filed Feb. 1, 2006, and claims priority of JP2005-083747 filed Mar. 23, 2005, incorporated by reference.

BACKGROUND

1. Technical Field

The present patent disclosure relates to a composite dielectric sheet, a method for producing the composite dielectric sheet, and a multilayer electronic component including the composite dielectric sheet. The disclosure particularly relates to the improvement of dielectric properties of the composite dielectric sheet.

2. Background Art

Dielectric sheets are used to manufacture multilayer electronic components such as monolithic capacitors, rolled capacitors (film capacitors), and multilayer wiring boards. The dielectric sheets need to meet various requirements, including those described below.

For the size reduction of the multilayer electronic components, the dielectric sheets need to have large dielectric constants. Furthermore, the dielectric sheets need to have high dielectric strength if the dielectric sheets are used for electronic components, such as capacitors, for use in power supply circuits for power electronics such as fuel cells, wind power generators, and hybrid cars. The power electronics market is expanding because environmental issues are attracting much attention.

On the other hand, the dielectric sheets need to be flexible if the dielectric sheets are used for rolled capacitors or flexible multilayer wiring boards that can follow the shape of surrounding members. Therefore, flexible films made of resin have been used for the above applications instead of the dielectric sheets.

The resin usually has a dielectric constant of about two to five; hence, it is difficult to prepare flexible films having large dielectric constants using the resin.

The following sheets have also been proposed (for example, in Patent Documents 1 to 3, below): flexible composite dielectric sheets which have a large dielectric constant which contain resins and high-dielectric constant fillers, dispersed in the resins, containing high-dielectric constant components such as dielectric ceramic components. Since the composite dielectric sheets are flexible and have large dielectric constants, the composite dielectric sheets can meet requirements for size reduction.

In the composite dielectric sheets, the interfaces between the resins and the fillers are discontinuous and therefore may cause dielectric breakdown. Hence, there is a problem in that the composite dielectric sheets have low dielectric strength. If the fillers are not uniformly dispersed in the resins, the composite dielectric sheets have pores. This causes a problem that the composite dielectric sheets have low dielectric strength.

Patent Document 1 discloses a method for producing a composite dielectric sheet. In the method, a mixture of a molten resin and a filler is formed into a sheet-shaped piece by a dry process. Patent Documents 2 and 3 each disclose another method for producing a composite dielectric sheet by a wet process in which a slurry is prepared by dispersing a filler in an organic solvent solution of a resin and then formed into a sheet-shaped piece, which is dried.

In order to solve the problems regarding low dielectric strength, the sheet formed by the dry process is hot-pressed such that the pores in the sheet are reduced as disclosed in Patent Document 1. It is difficult to uniformly disperse the filler, of which the volume content is 20% or more, in the resin as long as the dry process is used; hence, it is substantially impossible for the composite dielectric sheet to have a dielectric constant of six or more.

The composite dielectric sheet disclosed in Patent Document 2 has a large dielectric constant. Although Patent Document 2 does not describe the dielectric strength of the composite dielectric sheet, the dielectric strength thereof is believed to be low because no measure is taken to eliminate the discontinuity of the resin-filler interfaces.

The composite dielectric sheet disclosed in Patent Document 3 has a large dielectric constant and is prepared in such a manner that the filler is surface-treated with a silane-coupling agent and the slurry is prepared by dispersing the resulting filler in a solution prepared by mixing polyphenylene oxide (PPO), a crosslinking resin, and a reaction initiator and is then formed into such a sheet-shaped piece. PPO has no reactive functional group and therefore has low adhesion with the crosslinking resin. Furthermore, the reaction initiator serves as an impurity. Hence, the dielectric strength of this composite dielectric sheet is believed to be low.

Patent Document 1: Japanese Unexamined Patent Application Publication No. 2000-294447
Patent Document 2: Japanese Unexamined Patent Application Publication No. 3-208324
Patent Document 3: Japanese Unexamined Patent Application Publication No. 6-52716

SUMMARY

The present disclosure provides a composite dielectric sheet capable of solving the above problems. In particular, the composite dielectric sheet is flexible and has a large dielectric constant and high dielectric strength. The disclosure also provides a method for producing the composite dielectric sheet.

A multilayer electronic component including the composite dielectric sheet is described as well.

In order to solve the above technical problems, a composite dielectric sheet may contain a polyvinyl acetal resin; a high-dielectric constant filler, surface-treated with a coupling agent, dispersed in the polyvinyl, acetal resin; and a crosslinking agent having two or more functional groups reactable with the polyvinyl acetal resin and the surface-treated high-dielectric constant filler.

The coupling agent is preferably a silane coupling agent having an amino group or an epoxy group.

The high-dielectric constant filler preferably has a dielectric constant of 10 or more.

The crosslinking agent is preferably a polyisocyanate.

The composite dielectric sheet may further contain an epoxy resin. In this case, the crosslinking agent preferably has functional groups reactable with the polyvinyl acetal resin, the surface-treated high-dielectric constant filler, and the epoxy resin.

A method for producing the composite dielectric sheet may include a step of preparing a slurry by mixing a solvent, a polyvinyl acetal resin, a high-dielectric constant filler surface-treated with a coupling agent, and a crosslinking agent having two or more functional groups reactable with the polyvinyl acetal resin and the surface-treated high-dielectric constant filler; a step of preparing an uncured sheet in such a manner that the slurry is formed into a sheet-shaped piece and the solvent is then vaporized; and a step of heating the uncured sheet such that a crosslinking reaction occurs therein.

Furthermore, a multilayer electronic component advantageously includes the composite dielectric sheet.

Since the composite dielectric sheet contains the polyvinyl acetal resin and the high-dielectric constant filler, which is surface-treated with the coupling agent, functional groups formed on the surface of the high-dielectric constant filler by the coupling agent are linked to functional groups of the polyvinyl acetal resin with the crosslinking agent having such two or more functional groups. This eliminates the discontinuity of the interface between the filler and the resin, the discontinuity causing dielectric breakdown.

As is clear from experiments described below, the composite dielectric sheet has high dielectric strength at room temperature because the composite dielectric sheet contains the polyvinyl acetal resin.

Therefore, the composite dielectric sheet has high dielectric strength. Furthermore, the composite dielectric sheet is flexible and has a large dielectric constant because the composite dielectric sheet contains the high-dielectric constant filler.

Therefore, if the composite dielectric sheet is used to manufacture a multilayer electronic component, the multilayer electronic component has high dielectric strength. The composite dielectric sheet is effective for reduction in the size of multilayer electronic components.

The polyvinyl acetal resin is thermoplastic and can be formed into a film by the vaporization of a solvent. An uncured sheet prepared therefrom has sufficient strength and can be readily handled. The polyvinyl acetal resin is useful in preparing sheets at high speed. Therefore, the composite dielectric sheet can be produced at a high production rate.

When the composite dielectric sheet further contains the epoxy resin, the composite dielectric sheet has high dielectric strength at high temperature.

When the composite dielectric sheet contains the epoxy resin as described above, the crosslinking agent preferably has functional groups reactable with the polyvinyl acetal resin, the surface-treated high-dielectric constant filler, and the epoxy resin. The crosslinking agent is preferably a polyisocyanate regardless of whether the composite dielectric sheet contains the epoxy resin or not.

A method for producing the composite dielectric sheet is as follows: a slurry is prepared by mixing a solvent, the polyvinyl acetal resin, the high-dielectric constant filler, and the crosslinking agent and is then formed into a sheet-shaped piece, the solvent is vaporized, and the sheet-shaped piece is heat-treated such that the composite dielectric sheet is obtained. Hence, the dispersion of the high-dielectric constant filler is fine and the sheet has substantially no pores.

Thus, the disclosed method is effective in imparting high dielectric strength to the composite dielectric sheet.

The polyvinyl acetal resin is thermoplastic and can be formed into a film by the vaporization of the solvent. An uncured sheet prepared therefrom has sufficient strength and can be readily handled. The polyvinyl acetal resin is useful in preparing sheets at high speed. Therefore, the composite dielectric sheet can be produced at a high production rate.

Other features and advantages will become apparent from the following description of embodiments which refers to the accompanying drawings.

DETAILED DESCRIPTION OF EMBODIMENTS

Reference Numerals
1 monolithic capacitor
2, 12, and 23 laminates
3, 14, 15, and 22 composite dielectric sheets A composite dielectric sheet is preferably prepared in such a manner that a high-dielectric constant filler is surface-treated with a coupling agent so as to have reactive functional groups, the resulting high-dielectric constant filler and a crosslinking agent are added to an organic solvent solution of a polyvinyl acetal resin and are then sufficiently dispersed therein, and the dispersion is formed into a sheet-shaped piece, which is then heat-treated. The crosslinking agent has two or more functional groups for bonding the polyvinyl acetal resin and the high-dielectric constant filler together.

The polyvinyl acetal resin has a hydroxyl group that is a reactive functional group. Examples of the polyvinyl acetal resin include polyvinyl butyral, polyvinyl formal, and a mixture thereof.

The polyvinyl acetal resin has an acetal moiety with an alkyl group represented by the formula $C_nH_{2n+1}$, wherein n is preferably zero to four and more preferably zero or one. When n is greater than four, the polyvinyl acetal resin may have a low glass transition point and low heat resistance.

Preferable examples of a material for forming the high-dielectric constant filler include dielectric ceramics such as barium titanate, calcium titanate, strontium titanate, calcium zirconate, and lead zirconate titanate.

The high-dielectric constant filler preferably has an average particle size of 2 µm or less and more preferably 1 µm or less. The content of the high-dielectric constant filler in the composite dielectric sheet is preferably five to 50 volume percent. When the content thereof is less than five volume percent, the composite dielectric sheet has an insufficient dielectric constant. When the content thereof is greater than 50 volume percent, the composite dielectric sheet may have pores, which cause a reduction in dielectric strength.

A preferable example of the coupling agent, which is used to surface-treat the high-dielectric constant filler, is a silane coupling agent having an amino group or an epoxy group. Another example of the coupling agent is a titanate having a hydroxy group. Before the high-dielectric constant filler is added to the organic solvent solution of the polyvinyl acetal resin, the high-dielectric constant filler is surface-treated with the coupling agent. Alternatively, the following process may be used to surface-treat the high-dielectric constant filler: an integral blending process in which the coupling agent is added to the slurry prepared by adding the untreated high-dielectric constant filler to the organic solvent solution of the polyvinyl acetal resin.

An example of the crosslinking agent, which has two or more functional groups, is a polyisocyanate. The crosslinking agent is usually added to a mixture of the high-dielectric constant filler and the organic solvent solution of the polyvinyl acetal resin.

In order to prepare the slurry by adding the high-dielectric constant filler and the crosslinking agent to the organic solvent solution of the polyvinyl acetal resin, these components are subjected to dispersion treatment. The following apparatus may be used to subject these components to dispersion treatment: a high pressure homogenizer or a medium-stirring mill, such as a ball mill or a sand mill, containing a mixing medium.

The following process can be used to form the slurry into a sheet-shaped piece: for example, a doctor blade process, a gravure printing process, or a die coating process.

The composite dielectric sheet may further contain an epoxy resin. In this case, if the crosslinking agent is a polyisocyanate having a functional group reactable with both of the polyvinyl acetal resin, which is thermoplastic, and the epoxy resin, which is heat-curable, the composite dielectric sheet exhibits high dielectric strength at an elevated temperature, for example, 150° C. This is probably because the crosslinking agent reacts with both of the thermoplastic resin and the heat-curable resin and therefore the resin has high heat resistance.

The epoxy resin preferably has an epoxy equivalent of 150 to 300. When the epoxy equivalent thereof is less than 150, the crosslink density is low and therefore the heat resistance is insufficient. When the epoxy equivalent thereof is greater than 300, the number of hydroxy groups generated by reaction is large. This causes an increase in dielectric loss tangent and a reduction in heat resistance.

When the sum of the amount of the polyvinyl acetal resin, the amount of the epoxy resin, and the amount of the polyisocyanate is 100 weight parts, the amount of the polyvinyl acetal resin is preferably 20 to 80 weight parts and more preferably 30 to 70 weight parts. If the amount of the polyvinyl acetal resin is less than 20 weight parts, there is a problem in that the slurry is difficult to dry and therefore the rate of forming a sheet is low. If the amount of the polyvinyl acetal resin is greater than 80 weight parts, the sum of the amount of the epoxy resin and the amount of the polyisocyanate is excessively small and therefore the heat resistance is insufficient.

When the sum of the amount of the polyvinyl acetal resin, the amount of the epoxy resin, and the amount of the polyisocyanate is 100 weight parts, the amount of the epoxy resin is preferably five weight parts or more and more preferably ten weight parts or more. If the amount of the epoxy resin is less than five weight parts, the heat resistance is insufficient.

When the sum of the amount of the polyvinyl acetal resin, the amount of the epoxy resin, and the amount of the polyisocyanate is 100 weight parts, the amount of the polyisocyanate is preferably five weight parts or more and more preferably ten weight parts or more. If the amount of the polyisocyanate is less than five weight parts, the polyvinyl acetal resin and the epoxy resin cannot be sufficiently crosslinked to each other. This causes a reduction in dielectric strength and/or a reduction in heat resistance.

A multilayer electronic component including composite dielectric sheets will now be described.

Figure 1:
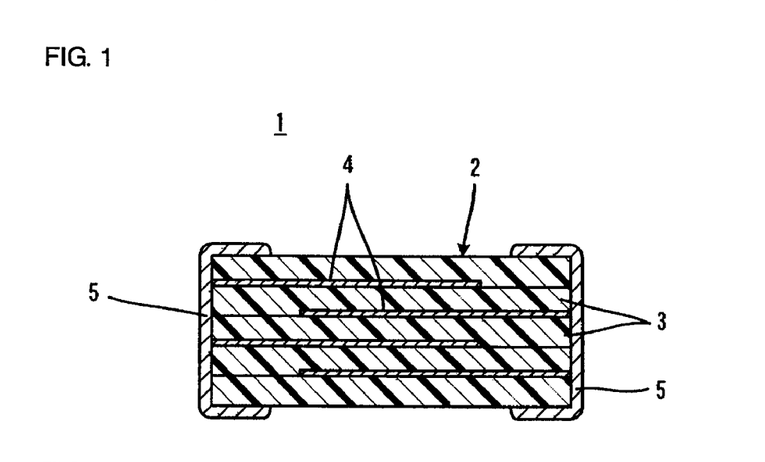
FIG. 1 is a sectional view of a monolithic capacitor 1 that is a first example of a multilayer electronic component including composite dielectric sheets.

FIG. 1 is a sectional view of a monolithic capacitor 1 that is a first example of the multilayer electronic component.

The monolithic capacitor 1 includes a laminate 2 with a rectangular parallelepiped shape. The laminate 2 includes a plurality of composite dielectric sheets 3 and conductive layers 4 each disposed between the composite dielectric sheets 3 next to each other.

Terminal electrodes 5 are disposed on both end portions of the laminate 2. Some of the conductive layers 4 extend to one of the end portions thereof and are electrically connected to one of the terminal electrodes 5. The other conductive layers 4 extend to the other one of the end portions thereof and are electrically connected to the other one of the terminal electrodes 5. The conductive layers 4 electrically connected to one of the terminal electrodes 5 and the conductive layers 4 connected to the other one are alternately arranged. A sub-capacitor formed between each pair of the conductive layers 4 that are opposed to each other with each composite dielectric sheet 3 disposed therebetween is discharged through the terminal electrodes 5.

Figure 2:
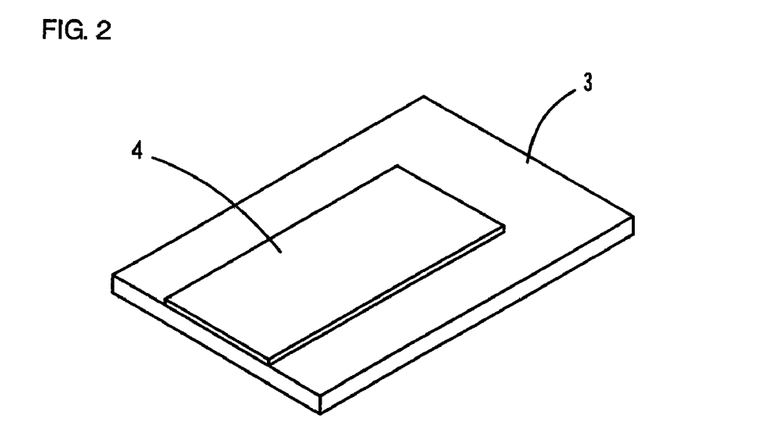
FIG. 2 is a perspective view of one of the composite dielectric sheets having conductive layers 4 used to manufacture the monolithic capacitor 1 shown in FIG. 1.

In order to manufacture the monolithic capacitor 1, the composite dielectric sheets 3 having the conductive layers 4 thereon are prepared as shown in FIG. 2. The conductive layers 4 may principally contain, for example, aluminum or zinc and may be formed by a vacuum vapor deposition process. The conductive layers 4 may each include a plurality of aluminum sublayers and zinc sublayers. With reference to FIG. 2, each conductive layer 4 does not reach one of the ends of the respective composite dielectric sheet 3.

The composite dielectric sheets 3 shown in FIG. 2 are stacked, whereby the laminate 2 is prepared. In the stacking operation, the composite dielectric sheets 3 are arranged such that the margins of the composite dielectric sheets 3 that are exposed from the conductive layers 4 are alternately located on opposite sides of the laminate 2.

The terminal electrodes 5 are formed on both end portions of the laminate 2 by metal spraying, whereby the monolithic capacitor 1 is obtained. The terminal electrodes 5 may principally contain zinc and tin.

Figure 3:
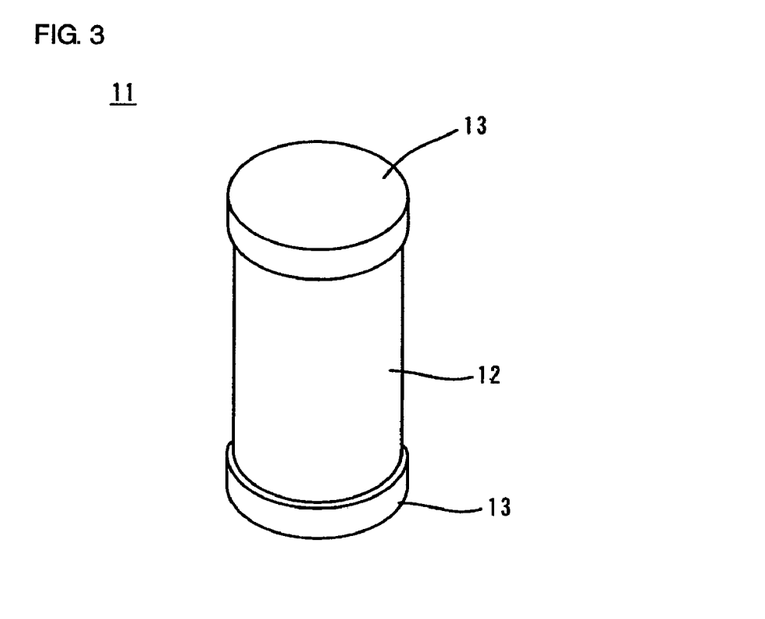
FIG. 3 is a perspective view of a rolled capacitor 11 that is a second example of the multilayer electronic component, which includes the composite dielectric sheets.

FIG. 3 is a perspective view of a rolled capacitor 11 that is a second example of the multilayer electronic component.

The rolled capacitor 11 includes a laminate 12 with a cylindrical shape. Terminal electrodes 13 are disposed on both end portions of the laminate 12. The terminal electrodes 13, as well as the terminal electrodes 5 shown in FIG. 1, may principally contain zinc and tin and may be formed by metal spraying.

Figure 4:
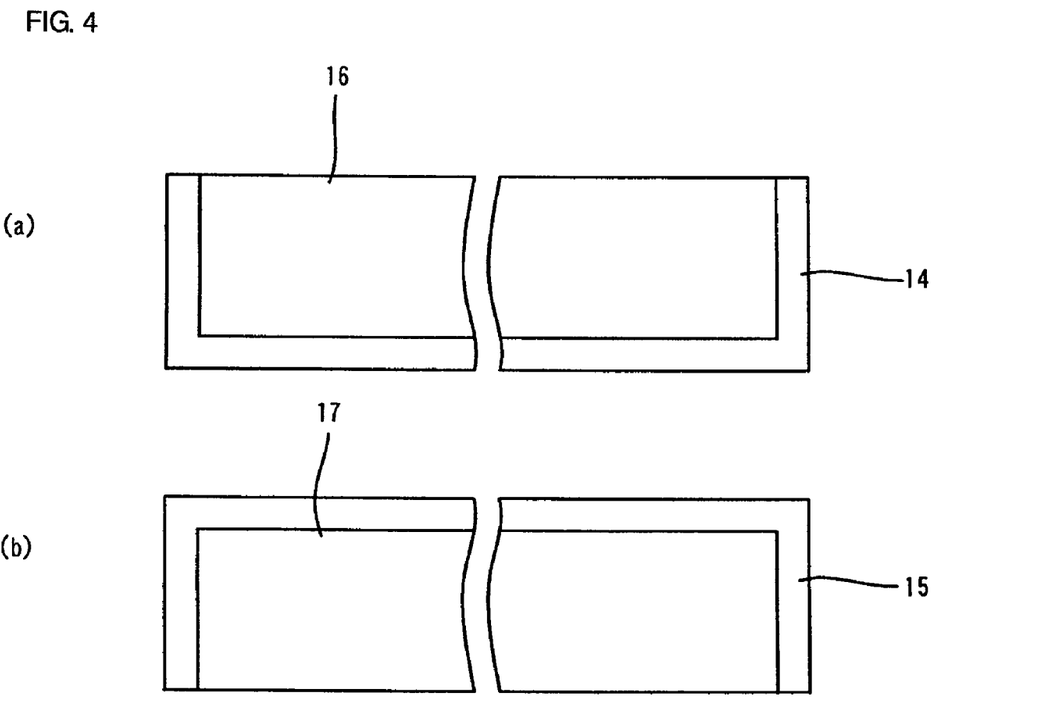
FIG. 4 includes plan views of the composite dielectric sheets 14 and 15 having conductive layers 16 and 17 used to manufacture the rolled capacitor 11 shown in FIG. 3.

The laminate 12 is prepared in such a manner that a composite dielectric sheet 14 shown in FIG. 4(a) and a composite dielectric sheet 15 shown in FIG. 4(b) are rolled together. Therefore, the laminate 12 has a multilayer structure in which the composite dielectric sheets 14 and 15 are laminated together.

With reference to FIG. 4(a), a conductive layer 16 extends on the composite dielectric sheet 14 such that margins are each present on the leading side, the trailing side, or the lower end side of the composite dielectric sheet 14. With reference to FIG. 4(b), a conductive layer 17 extends on the composite dielectric sheet 15 such that margins are each present on the leading side, the trailing side, or the lower end side of the composite dielectric sheet 15. The conductive layers 16 and 17 may be made of the same material as that for forming the conductive layers 4 shown in FIGS. The conductive layers 16 and 17 may be formed by the same process as that for forming the conductive layers 4.

The conductive layer 16 extends on the composite dielectric sheet 14 to form such a pattern as shown in FIG. 4(a) and the conductive layer 17 extends on the composite dielectric sheet 15 to form such a pattern as shown in FIG. 4(b). Therefore, although the composite dielectric sheets 14 and 15 are rolled together such that the laminate 12 is prepared, the conductive layers 16 and 17 are not in electrical contact with each other.

The conductive layer 16 is exposed at one end face of the laminate 12 and is electrically connected to one of the terminal electrodes 13. The conductive layer 17 is exposed at another end face of the laminate 12 and is electrically connected to the other one of the terminal electrodes 13. A sub-capacitor formed between the conductive layers 16 and 17 that are opposed to each other with the composite dielectric sheet 14 or 15 disposed therebetween is discharged through the terminal electrodes 13.

Figure 5:
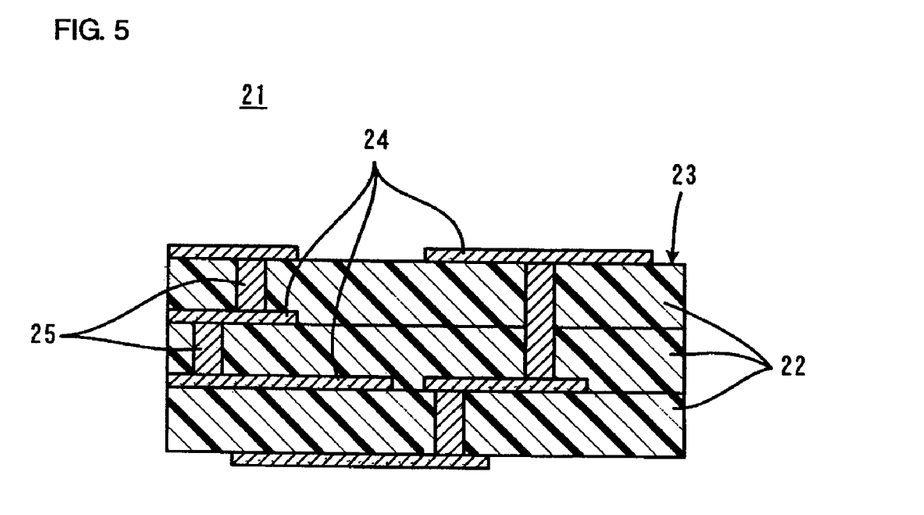
FIG. 5 is a sectional view of a multilayer wiring board 21 that is a third example of the multilayer electronic component, which includes the composite dielectric sheets.

FIG. 5 is a sectional view of a multilayer wiring board 21 that is a third example of the multilayer electronic component.

The multilayer wiring board 21 includes a laminate 23 including a plurality of laminated composite dielectric sheets 22. The composite dielectric sheets 22 have conductive layers 24 disposed thereon. The composite dielectric sheets 22 include via-hole conductors 25 that extend through the composite dielectric sheets 22 in the thickness direction of the composite dielectric sheets 22. The conductive layers 24 and the via-hole conductors 25 may be formed in such a manner that a conductive paste principally containing, for example, copper is provided on the conductive layers 24 and is then dried.

Examples of the multilayer electronic component that include the disclosed composite dielectric sheets are described above with reference to FIGS. 1 to 5. The examples thereof are only for exemplification. A multilayer electronic component with another shape or structure may include a composite dielectric sheet as described herein.

Experiments performed to confirm advantages of the dielectric sheet will now be described.

[Experiment 1]

In Experiment 1, composite dielectric sheets were prepared and were used as the following samples as shown in Table 1: Samples 1 to 7 that were examples within the scope of the present disclosure; and Samples 8 to 12 that were outside the scope of the present disclosure and were used as comparative examples.

size of 0.5 μm. Coupling agents used to surface-treat the fillers were an epoxy group-containing silane, an amino group-containing silane, hydroxy group-containing titanate A, and hydroxy group-containing titanate B.

Hydroxy group-containing titanates A and B described above had a hydrophilic moiety with a hydrolyzable group and a hydrophobic moiety with an organic functional group as shown in Table 2.

TABLE 2

| | Hydrolyzable group of hydrophilic moiety | Organic functional group of hydrophobic moiety |
|---|---|---|
| Hydroxy group-containing titanate A | $C_8H_{17}O-$ | $HO-P-(OC_{13}H_{27})_2$ $C_8H_{17}O-$ |
| Hydroxy group-containing titanate B | $CH_3$ $\mid$ $CH_3-CH-O-$ | $HO-P-(OC_8H_{17})_2$ |

Crosslinking agents used were polyisocyanate A, polyisocyanate B, and a combination of an epoxy resin and a phenol resin. Polyisocyanate A was a solution with a polyisocyanate concentration of 10.7% and polyisocyanate B was a solution with a polyisocyanate concentration of 8.5%.

Toluene and ethanol were mixed at a weight ratio of 1:1, whereby a liquid mixture was prepared. The polyvinyl butyral was dissolved in the liquid mixture, whereby a ten weight percent polyvinyl butyral solution was prepared. Each polyisocyanate was dissolved in the liquid mixture, whereby a ten weight percent polyisocyanate solution was prepared. The epoxy resin was dissolved in the liquid mixture, whereby a ten weight percent epoxy resin solution was prepared. The phenol resin was dissolved in the liquid mixture, whereby a ten weight percent phenol resin solution was prepared.

The fillers specified in the "fillers" column of Table 1 were surface-treated with the corresponding coupling agents specified in the "coupling agents" column of this table and were then used to prepare corresponding Samples 1 to 7. In particular, 100 g of each filler, 0.82 g of each coupling agent, 47.5 g of ethanol, and 2.5 g of water were charged into a ball mill and were then mixed for one hour such that a slurry was

TABLE 1

| Samples | Polyvinyl acetal | Fillers | Coupling agents | Crosslinking agents |
|---|---|---|---|---|
| 1 | Polyvinyl butyral | $SrTiO_3$ | Epoxy group-containing silane | Polyisocyanate A |
| 2 | Polyvinyl butyral | $CaTiO_3$ | Epoxy group-containing silane | Polyisocyanate A |
| 3 | Polyvinyl butyral | $BaTiO_3$ | Epoxy group-containing silane | Polyisocyanate B |
| 4 | Polyvinyl butyral | $BaTiO_3$ | Hydroxy group-containing titanate A | Polyisocyanate A |
| 5 | Polyvinyl butyral | $BaTiO_3$ | Hydroxy group-containing titanate B | Polyisocyanate A |
| 6 | Polyvinyl butyral | $BaTiO_3$ | Amino group-containing silane | Polyisocyanate A |
| 7 | Polyvinyl butyral | $BaTiO_3$ | Epoxy group-containing silane | Polyisocyanate A |
| 8* | Polyvinyl butyral | $BaTiO_3$ | None | None |
| 9* | Polyvinyl butyral | $CaTiO_3$ | None | None |
| 10* | Polyvinyl butyral | $BaTiO_3$ | Amino group-containing silane | None |
| 11* | Polyvinyl butyral | $BaTiO_3$ | None | Polyisocyanate A |
| 12* | Polyvinyl butyral | $BaTiO_3$ | Epoxy group-containing silane | Epoxy resin and phenol resin |

As shown in Table 1, a polyvinyl acetal used was a polyvinyl butyral having a glass transition point of 70° C. and a degree of polarization of 800.

Fillers used were a strontium titanate ($SrTiO_3$) powder with an average particle size of 0.3 μm, a calcium titanate ($CaTiO_3$) powder with an average particle size of 0.5 μm, and a barium titanate ($BaTiO_3$) powder with an average particle prepared, the slurry was dried at 80° C. for 15 hours and was then heat-treated at 120° C. for two hours such that a solid was prepared, and the solid was crashed.

The resulting filler and a portion of the polyvinyl butyral solution were mixed for six hours in a ball mill, whereby the filler was dispersed therein. The residual portion of the polyvinyl butyral solution and a solution of one of the crosslinking agents specified in the "coupling agents" column of this table were mixed with the dispersion. The mixture was stirred for 12 hours, whereby a slurry was prepared.

The content of the filler in the slurry was adjusted such that the volume of the filler was 30% of the sum of the volume of a resin component containing the polyvinyl butyral and the crosslinking agent and the volume of the filler after a crosslinking reaction described below was carried out. The volume of the strontium titanate powder was determined by dividing the weight thereof by the density thereof, that is, 5.05. The volume of the calcium titanate powder was determined by dividing the weight thereof by the density thereof, that is, 4.04. The volume of the barium titanate powder was determined by dividing the weight thereof by the density thereof, that is, 6.00.

The slurry was formed into a sheet-shaped piece by a doctor blade process using a carrier film and the sheet-shaped piece was dried at 90° C. for one minute, whereby an uncured sheet with a thickness of 6 μm was prepared. The uncured sheet was heat-treated at 150° C. for one hour, whereby the crosslinking reaction was carried out. According to this procedure, Samples 1 to 7 were prepared. Samples 1 to 7 each contained 30 volume percent of one of the fillers.

Sample 8 was prepared in substantially the same manner as that for preparing Sample 3 except that the filler used to prepare Sample 8 was not surface-treated with any coupling agent, no crosslinking agent was used, and the amount of the polyvinyl butyral used was increased instead.

Sample 9 was prepared in substantially the same manner as that for preparing Sample 2 except that the filler used to prepare Sample 9 was not surface-treated with any coupling agent, no crosslinking agent was used, and the amount of the polyvinyl butyral used was increased instead.

Sample 10 was prepared in substantially the same manner as that for preparing Sample 6 except that no crosslinking agent was used and the amount of the polyvinyl butyral used was increased instead.

Sample 11 was prepared in substantially the same manner as that for preparing one of Samples 4 to 7 except that the filler used to prepare Sample 11 was not surface-treated with any coupling agent.

Sample 12 was prepared in substantially the same manner as that for preparing Sample 7 except that the crosslinking agent used to prepare Sample 12 was a mixture of the epoxy resin and the phenol resin, which were curable resins, and the weight ratio of the epoxy resin to the phenol resin was 141:84.

Electrodes principally containing aluminum were formed on both principal surfaces of each of Samples 1 to 12 by a vacuum vapor deposition process. Samples 1 to 12 were then evaluated for electrical properties as shown in Table 3. That is, Samples 1 to 12 were measured for dielectric constant $\epsilon_r$ and dielectric loss tangent tan σ at a frequency of 1 kHz and a voltage of 1 V using an LCR meter (4284A, manufactured by Agilent). Furthermore, Samples 1 to 12 were measured for dielectric strength using a dielectric breakdown tester (HTV-501A, manufactured by S. Y. Electronics) in such a manner that Samples 1 to 12 were immersed in room temperature oil.

TABLE 3

| Samples | Dielectric constant at 1 kHz | tan σ at 1 kHz | Dielectric strength at room temperature (V/μm) |
|---|---|---|---|
| 1 | 10.7 | 0.011 | 209 |
| 2 | 9.8 | 0.009 | 208 |
| 3 | 11.2 | 0.015 | 197 |

TABLE 3-continued

| Samples | Dielectric constant at 1 kHz | tan σ at 1 kHz | Dielectric strength at room temperature (V/μm) |
|---|---|---|---|
| 4 | 10.5 | 0.012 | 164 |
| 5 | 11.2 | 0.012 | 163 |
| 6 | 11.2 | 0.015 | 140 |
| 7 | 11.2 | 0.013 | 130 |
| 8* | 9.7 | 0.011 | 92 |
| 9* | 9.6 | 0.012 | 101 |
| 10* | 10.9 | 0.019 | 105 |
| 11* | 11.3 | 0.013 | 100 |
| 12* | 11.6 | 0.023 | 65 |

As shown in Table 1, Samples 1 to 7 contain the fillers surface-treated with the coupling agents and the crosslinking agents having two or more functional groups. Hence, functional groups provided on surface portions of the fillers by the coupling agents are linked to functional groups of the polyvinyl acetal resin with polyisocyanate A or B. This eliminates the discontinuity of the interface between each filler and the resin, the discontinuity causing dielectric breakdown. Therefore, the composite dielectric sheets have large dielectric constants and high dielectric strength as shown in Table 3.

In contrast, Samples 8 to 11 lack either the fillers surface-treated with the coupling agents or the crosslinking agents. This prevents the fillers from being linked to the resin. Therefore, Samples 8 to 11 have low dielectric strength.

Sample 12 contains no polyisocyanate and therefore has low dielectric strength. This is probably because no polyisocyanate is present in the composite dielectric sheet and therefore pores remain in the composite dielectric sheet in a curing step.

[Experiment 2]

In Experiment 2, composite dielectric sheets containing an epoxy resin were evaluated.

In Experiment 2, a polyvinyl acetal resin used was a polyvinyl acetoacetal having a glass transition point of 110° C. and a degree of polymerization of about 2000. An epoxy resin used was a bisphenol-A epoxy resin. A filler used was a strontium titanate ($SrTiO_3$) powder with an average particle size of 0.3 μm. A coupling agent used to surface-treat the filler was an epoxy group-containing silane. A crosslinking agent used was a TDI-type blocked polyisocyanate prepared by blocking an isocyanate.

Toluene and ethanol were mixed at a weight ratio of 1:1, whereby a liquid mixture was prepared. The polyvinyl acetoacetal was dissolved in the liquid mixture, whereby an eight weight percent polyvinyl acetoacetal solution was prepared. The bisphenol-A epoxy resin was dissolved in the liquid mixture, whereby a 50 weight percent bisphenol-A epoxy resin solution was prepared. The TDI-type blocked polyisocyanate was dissolved in the liquid mixture, whereby a 60 weight percent TDI-type blocked polyisocyanate solution was prepared.

The strontium titanate powder was surface-treated with the epoxy group-containing silane and was dispersed in the liquid mixture in such a manner that 100 weight parts of the strontium titanate powder, one weight part of the epoxy group-containing silane, and 80 weight parts of the liquid mixture were mixed in a ball mill for eight hours.

The strontium titanate powder surface-treated with the epoxy group-containing silane was mixed with the polyvinyl acetoacetal solution, the bisphenol-A epoxy resin solution, and the TDI-type blocked polyisocyanate solution at ratios (weight ratios) shown in Table 4, whereby slurries were prepared. Sample 25 shown in Table 4 contains no epoxy resin and therefore is a comparative example.

TABLE 4

| Samples | Polyvinyl acetoacetal solution | Bisphenol-A epoxy resin solution | TDI-type blocked polyisocyanate solution |
|---|---|---|---|
| 21 | 183.1 | 41.0 | 21.1 |
| 22 | 311.4 | 24.9 | 20.8 |
| 23 | 305.2 | 29.3 | 15.1 |
| 24 | 427.22 | 17.6 | 9.1 |
| 25* | 274.0 | 0 | 3.6 |

The content of the strontium titanate powder in each slurry was adjusted such that the volume of the strontium titanate powder was 30% of the sum of the volume of a resin component containing the polyvinyl acetoacetal, the bisphenol-A epoxy resin, and the TDI-type blocked polyisocyanate and the volume of the strontium titanate powder after a crosslinking reaction described below was carried out. The volume of the strontium titanate powder was determined by dividing the weight thereof by the density thereof, that is, 5.05.

The slurry was formed into a sheet-shaped piece by a doctor blade process using a carrier film and the sheet was dried at 90° C. for one minute, whereby an uncured sheet with a thickness of 10 μm was prepared. The uncured sheet was heat-treated at 180° C. for one hour, whereby the crosslinking reaction was carried out. According to this procedure, Samples 21 to 25 were prepared. Samples 21 to 25 contained 30 volume percent of the strontium titanate powder.

Electrodes principally containing aluminum were formed on both principal surfaces of each of Samples 21 to 25 by a vacuum vapor deposition process. Samples 21 to 25 were then evaluated for electrical properties as shown in Table 5. That is, Samples 21 to 25 were measured for dielectric constant $\epsilon_r$ and dielectric loss tangent tan σ at a frequency of 1 kHz and a voltage of 1 V using an LCR meter similar to that described in Experiment 1. Furthermore, Samples 21 to 25 were measured for dielectric strength using a dielectric breakdown tester similar to that described in Experiment 1 in such a manner that Samples 21 to 25 were immersed in oil maintained at 150° C.

TABLE 5

| Samples | Polyacetal percentage | Dielectric constant at 1 kHz | tan σ at 1 kHz | Dielectric strength at room 150° C. (V/μm) |
|---|---|---|---|---|
| 21 | 30 | 14.8 | 0.010 | 292 |
| 22 | 50 | 13.1 | 0.010 | 224 |
| 23 | 51 | 12.4 | 0.010 | 216 |
| 24 | 70 | 11.4 | 0.012 | 244 |
| 25* | 91 | 10.7 | 0.011 | Less than 10 |

Table 5 shows the percentage of the polyacetal. The polyacetal percentage is determined by the following equation: polyacetal percentage (%)=weight of polyacetal/(weight of polyacetal+weight of epoxy resin+weight of polyisocyanate)×100.

As shown in Table 5, Samples 21 to 24, which are the composite dielectric sheets prepared by the use of the thermoplastic resin (the polyvinyl acetal resin), the heat-curable resin (the epoxy resin), and the crosslinking agent, have high dielectric strength at 150° C.

On the other hand, Sample 25 prepared by the use of the thermoplastic resin (the polyvinyl acetal resin) and the crosslinking agent without using any heat-curable resin (any epoxy resin) has low dielectric strength at 150° C. Since the tester had a minimum scale of 10 V/μm and dielectric breakdown occurred in Sample 25 at less than 10 V/μm, Table 5 shows the Sample 25 has a dielectric strength of less than 10 V/μm.

The reason why Sample 25 has low dielectric strength at 150° C. is probably because the crosslinking of the thermoplastic resin with the crosslinking agent is insufficient to achieve high heat resistance. On the other hand, in Samples 21 to 24, the thermoplastic resin is linked to the heat-curable resin with the crosslinking agent; hence, Samples 21 to 24 have high heat resistance.

Although particular embodiments have been described, many other variations and modifications and other uses will become apparent to those skilled in the art. Therefore, the present invention is not limited by the specific disclosure herein.

What is claimed is:

1. A composite dielectric sheet capable of being used as part of a multilayer electronic component, the dielectric sheet containing:
   a polyvinyl acetal resin;
   a high-dielectric constant filler, surface-treated with a coupling agent, dispersed in the polyvinyl acetal resin; and
   a crosslinking agent having two or more functional groups reactable with the polyvinyl acetal resin and the surface-treated high-dielectric constant filler, said crosslinking agent being a polyisocyanate; and,
   optionally, an epoxy resin,
   wherein the sum of the amounts of polyvinyl acetal resin, epoxy resin and polyisocyanate is 100 parts by weight, the amount of polyvinyl acetal resin is 30 to 70 parts by weight and the amount of polyisocyanate is at least ten parts by weight.

2. The composite dielectric sheet according to claim 1, wherein the coupling agent is a silane coupling agent having an amino group or an epoxy group.

3. The composite dielectric sheet according to claim 1, wherein the high-dielectric constant filler has a dielectric constant of 10 or more.

4. The composite dielectric sheet according to claim 1, further containing an epoxy resin.

5. The composite dielectric sheet according to claim 4, wherein the crosslinking agent has functional groups reactable with the polyvinyl acetal resin, the surface-treated high-dielectric constant filler, and the epoxy resin.

6. A multilayer electronic component comprising the composite dielectric sheet according to claim 1.

7. The multilayer electronic component of claim 6, wherein said electronic component is a rolled capacitor or a flexible multilayer wiring board that can follow the shape of surrounding members.

8. The composite dielectric sheet according to claim 1, wherein the polyvinyl acetal resin has an acetal moiety with an alkyl group represented by the formula $C_nH_{2n+1}$, wherein n is zero to four.

9. The composite dielectric sheet according to claim 8, wherein n is zero or one.

10. The composite dielectric sheet according to claim 1, wherein said high-dielectric-constant filler comprises a dielectric ceramic including one or more of barium titanate, calcium titanate, strontium titanate, calcium zirconate, and lead zirconate titanate.

11. The composite dielectric sheet according to claim 1, wherein said high dielectric constant filler has an average particle size of 2 μm or less.

12. The composite dielectric sheet according to claim 1, wherein the content of the high-dielectric constant filler in the composite dielectric sheet is five to 50 volume percent.

13. The composite dielectric sheet according to claim 1, wherein said sheet has flexibility for being used as part of a flexible multilayer electronic component.

14. A flexible multilayer electronic component comprising the composite dielectric sheet according to claim 13.

15. A method for producing a composite dielectric sheet capable of being used as part of a multilayer electronic component, comprising the steps of:

preparing a slurry by mixing a solvent, a polyvinyl acetal resin, a high-dielectric constant filler surface-treated with a coupling agent, a crosslinking agent having two or more functional groups reactable with the polyvinyl acetal resin and the surface-treated high-dielectric constant filler, wherein said crosslinking agent is a polyisocyanate, and, optionally, an epoxy resin;

preparing an uncured sheet by forming the slurry into a sheet-shaped piece and then vaporizing the solvent; and heating the uncured sheet such that a crosslinking reaction occurs therein, wherein the sum of the amounts of polyvinyl acetal resin, epoxy resin and polyisocyanate is 100 parts by weight, the amount of polyvinyl acetal resin is 30 to 70 parts by weight and the amount of polyisocyanate is at least ten parts by weight.

16. The method of claim 15, wherein the slurry further contains an epoxy resin.

17. The method of claim 16, wherein the crosslinking agent has functional groups reactable with the polyvinyl acetal resin, the surface-treated high-dielectric constant filler, and the epoxy resin.

18. The method of claim 15, wherein the polyvinyl acetal resin has an acetal moiety with an alkyl group represented by the formula $C_nH_{2n+1}$, wherein n is zero to four.

19. The method of claim 18, wherein n is zero or one.

20. The method of claim 15, wherein said high-dielectric-constant filler comprises a dielectric ceramic including one or more of barium titanate, calcium titanate, strontium titanate, calcium zirconate, and lead zirconate titanate.

21. The method of claim 15, wherein said high dielectric constant filler has an average particle size of 2 μm or less.

22. The method of claim 15, wherein the content of the high-dielectric constant filler in the composite dielectric sheet is five to 50 volume percent.

23. The method of claim 15, wherein the composite dielectric sheet has flexibility for being used as part of a flexible multilayer electronic component.

* * * * *